US010062982B2

(12) United States Patent
Ju

(10) Patent No.: US 10,062,982 B2
(45) Date of Patent: Aug. 28, 2018

(54) ELECTRICAL CONNECTOR CAPABLE OF REDUCING PRE-SOLDERING STEP

(71) Applicant: LOTES CO., LTD, Keelung (TW)

(72) Inventor: Ted Ju, Keelung (TW)

(73) Assignee: LOTES CO., LTD, Keelung (TW)

( * ) Notice: Subject to any disclaimer, the term of this patent is extended or adjusted under 35 U.S.C. 154(b) by 0 days.

(21) Appl. No.: 15/698,051

(22) Filed: Sep. 7, 2017

(65) Prior Publication Data

US 2018/0205161 A1   Jul. 19, 2018

(30) Foreign Application Priority Data

Jan. 14, 2017   (CN) .................. 2017 2 0041445 U

(51) Int. Cl.
| H01R 12/00 | (2006.01) |
| H05K 1/00 | (2006.01) |
| H01R 12/57 | (2011.01) |
| H01L 23/498 | (2006.01) |
| H01L 23/31 | (2006.01) |

(52) U.S. Cl.
CPC .......... H01R 12/57 (2013.01); H01L 23/3114 (2013.01); H01L 23/3128 (2013.01); H01L 23/49816 (2013.01)

(58) Field of Classification Search
CPC ............... H01R 12/526; H01R 12/707; H01R 43/0235; H01R 43/0256; H01R 9/096; H01R 9/2491; H01R 12/57
USPC ...................................... 439/83, 626, 66, 71
See application file for complete search history.

(56) References Cited

U.S. PATENT DOCUMENTS

| 6,702,594 B2 * | 3/2004 | Lee ................. | H01R 4/028 439/70 |
| 7,040,903 B2 * | 5/2006 | Ju .................. | H01R 43/0235 439/71 |
| 7,682,165 B2 * | 3/2010 | Liao ................ | H05K 3/3426 439/342 |
| 8,052,436 B1 * | 11/2011 | Ju .................. | H01R 12/57 439/342 |
| 8,118,603 B2 * | 2/2012 | Ho .................. | H01R 12/57 439/626 |
| 8,147,256 B2 * | 4/2012 | Jin .................. | H01R 12/52 439/83 |

(Continued)

FOREIGN PATENT DOCUMENTS

| CN | 2718822 Y | 8/2005 |
| CN | 201781096 U | 3/2011 |
| CN | 202034525 U | 11/2011 |

*Primary Examiner* — Hae Moon Hyeon
(74) *Attorney, Agent, or Firm* — Locke Lord LLP; Tim Tingkang Xia, Esq.

(57) ABSTRACT

An electrical connector for electrically connecting a chip module to a circuit board includes an insulating body having stopping portions, terminals and solder balls. Each stopping portion is located above the solder balls, and has a bottom surface coated with an adhesive. Each terminal includes a connecting portion and two clamping portions extending and bending from two opposite sides of the connecting portion along a horizontal direction. The solder balls are in contact with the terminals and the circuit board, and each corresponds to one of the stopping portions, is adhered to the stopping portion via the adhesive, and is clamped by the two clamping portions and the connecting portion, or by the two clamping portions and the insulating body.

18 Claims, 12 Drawing Sheets

(56) References Cited

U.S. PATENT DOCUMENTS

| | | | | |
|---|---|---|---|---|
| 8,235,734 B2* | 8/2012 | Ju | ............................ | H01R 12/57 |
| | | | | 439/83 |
| 8,277,230 B2* | 10/2012 | Huo | ...................... | H01R 12/716 |
| | | | | 439/342 |
| 8,323,038 B2* | 12/2012 | Jin | ....................... | H01R 12/714 |
| | | | | 439/66 |
| 8,414,332 B2* | 4/2013 | Ju | ............................ | H01R 13/41 |
| | | | | 439/342 |
| 8,708,716 B1* | 4/2014 | Ho | ....................... | H01R 12/714 |
| | | | | 439/83 |
| 9,450,313 B2* | 9/2016 | Tsai | ........................ | H01R 4/027 |
| 2003/0186571 A1* | 10/2003 | Lin | ........................ | H01R 12/57 |
| | | | | 439/83 |

* cited by examiner

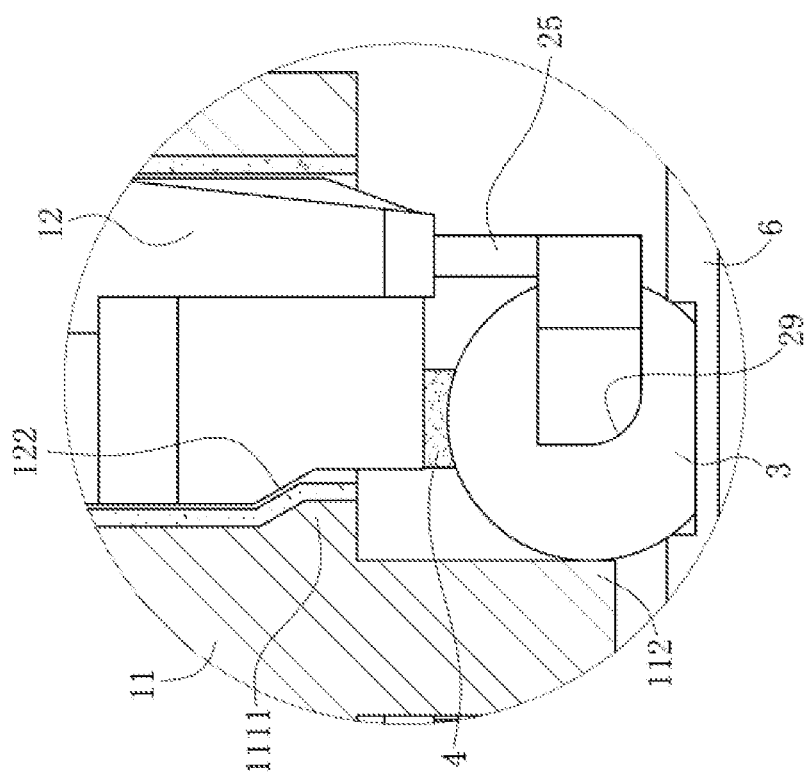

ELECTRICAL CONNECTOR CAPABLE OF REDUCING PRE-SOLDERING STEP

CROSS-REFERENCE TO RELATED PATENT APPLICATION

This non-provisional application claims priority under 35 U.S.C. § 119(a) on Patent Application No. 201720041445.3 filed in P.R. China on Jan. 14, 2017, the entire contents of which are hereby incorporated by reference.

Some references, if any, which may include patents, patent applications and various publications, may be cited and discussed in the description of this invention. The citation and/or discussion of such references, if any, is provided merely to clarify the description of the present invention and is not an admission that any such reference is "prior art" to the invention described herein. All references listed, cited and/or discussed in this specification are incorporated herein by reference in their entireties and to the same extent as if each reference was individually incorporated by reference.

FIELD OF THE INVENTION

The present invention relates to an electrical connector, and more particularly to an electrical connector which electrically connects a chip module to a circuit board.

BACKGROUND OF THE INVENTION

The background description provided herein is for the purpose of generally presenting the context of the invention. Work of the presently named inventors, to the extent it is described in this background section, as well as aspects of the description that may not otherwise qualify as prior art at the time of filing, are neither expressly nor impliedly admitted as prior art against the present invention.

Chinese Patent Application Number 201020513198.0 discloses an electrical connector used for electrically connecting a chip module to a circuit board. The electrical connector includes a body provided with multiple receiving slots and multiple terminals correspondingly received in the receiving slots. Each terminal has a fixing portion retained in the corresponding receiving slot and two clamping arms extending downward oppositely from the fixing portion, and the two clamping arms clamp an outer surface of a solder ball. However, the outer surface of the solder ball is a spherical surface, and the solder ball is only clamped by the two clamping arms, so the solder ball will fall off inevitably due to instable retaining, thereby reducing the production yield of the electrical connector.

Therefore, an unaddressed need exists in the art to address the aforementioned deficiencies and inadequacies.

SUMMARY OF THE INVENTION

Certain aspects of the present invention direct to an electrical connector, capable of reducing pre-soldering steps, improving the quality of electrical conduction of a terminal, and reducing the production cost of a product.

In certain embodiments, an electrical connector is used for electrically connecting a chip module to a circuit board, and includes: an insulating body having multiple receiving slots run through, a plurality of terminals respectively received in the receiving slots, and multiple solder balls for soldering the terminals to a circuit board. The terminals are used for contacting with a chip module. Each terminal has a connecting portion and two clamping portions bending and extending from two opposite sides of the connecting portion along a horizontal direction. Each solder ball is co-clamped by the two clamping portions and the connecting portion, or each solder ball is co-clamped by the two clamping portions and the insulating body. The insulating body is provided with multiple stopping portions, in correspondence to the solder balls, and located above the solder ball. A bottom surface of each of the stopping portion is coated with an adhesive, and the solder ball is adhered to the stopping portion via the adhesive.

In certain embodiments, the two clamping portions clamp a periphery of the solder ball on a horizontal center plane of the solder ball.

In certain embodiments, multiple protruding blocks protrude downward from a lower surface of the insulating body, each protruding block and the corresponding one of the connecting portions are located on two opposite sides of the solder ball, and the protruding block and the two clamping portions co-clamp corresponding one of the solder balls.

In certain embodiments, a notch is provided at a lower edge of the connecting portion, the insulating body is provided with a protruding portion received in the notch, and the protruding portion and the two clamping portions co-clamp corresponding one of the solder balls.

In certain embodiments, the stopping portion is formed by protruding downward from the lower surface of the insulating body.

In certain embodiments, a protruding block is formed by extending downward from the stopping portion, the protruding block and the two clamping portions co-clamping corresponding one of the solder balls.

In certain embodiments, the protruding block and the connecting portion are located on two opposite sides of the solder ball.

In certain embodiments, the insulating body includes a first body and multiple second bodies assembled on the first body, multiple receiving slots run through the first body, the second bodies are received in the receiving slots, the second bodies and the terminals are formed in an insert-molded manner, and the stopping portions are integrally formed on the second bodies.

In certain embodiments, side walls of the receiving slots are coated with metal plating layers.

In certain embodiments, the second body has a first inclined surface, a first stop block protrudes from the side surface of the receiving slot, and the first stop block is located below the first inclined surface and limits the second body from moving down.

In certain embodiments, the second body is provided with a positioning arm, a hook portion is formed at a tail end of the positioning arm, a second stop block protrudes from the side surface of the receiving slot, and the second stop block is located above the hook portion and limits the second body from moving up.

In certain embodiments, the second body is provided with a recessed portion to provide a space where the positioning arm elastically deforms, the recessed portion has a second inclined surface, and the distance, from top to bottom, between the second inclined surface and the positioning arm is gradually increased.

In certain embodiments, the terminal is provided with an extending arm embedded into the positioning arm.

In certain embodiments, each of the terminals is provided with a base, an elastic arm is formed by bending and extending upward from the base, and a contact portion is formed at a top end of the elastic arm and is in upward contact with the chip module; the extending arm is formed by vertically extending downward from one side of the base; and a strip connecting portion is formed by vertically extending upward from the opposite side of the base and is used for connecting a strip, the second body has a retaining block, and the strip connecting portion is embedded into the retaining block.

In certain embodiments, a recess is provided on one side of the strip connecting portion or the base.

In certain embodiments, an elastic portion extends downward from the base to a direction close to the extending arm so as to be connected to the connecting portion.

In certain embodiments, the base has an inclined side, and the distance, from top to bottom, between the inclined side and the extending arm is gradually increased.

In certain embodiments, each of the terminals includes a base in a flat shape, a clamp hook and an elastic portion are formed by vertically extending downward from the base, the elastic portion is connected to the connecting portion, a clearance is provided between the clamp hook and the elastic portion, an elastic arm is formed by bending and extending upward from the base, and a contact portion is formed at a top end of the elastic arm and is in upward contact with the chip module; and the strip connecting portion formed by vertically extending upward from the base is used for connecting a strip.

In certain embodiments, the stopping portion extends upward to an upper surface of the insulating body.

Compared with the related art, the present invention has the following beneficial effects.

The solder ball of the electrical connector of the present invention is adhered to a bottom surface of the stopping portion via the adhesive.

The two clamping portions and the connecting portion co-clamp the solder ball, or the two clamping portions and the insulating body co-clamp the solder ball, such that the solder ball is adhered to and stopped by the stopping portion in a vertical direction, and clamping forces in at least three directions are exerted in a horizontal direction, thereby improving the stability of the solder ball, and improving the production yield of the electrical connector.

These and other aspects of the present invention will become apparent from the following description of the preferred embodiment taken in conjunction with the following drawings and their captions, although variations and modifications therein may be affected without departing from the spirit and scope of the novel concepts of the invention.

BRIEF DESCRIPTION OF THE DRAWINGS

The accompanying drawings illustrate one or more embodiments of the invention and together with the written description, serve to explain the principles of the invention. Wherever possible, the same reference numbers are used throughout the drawings to refer to the same or like elements of an embodiment.

FIG. 5B is an enlarged view of a part that is highlighted by a circle in FIG. 5A.

DETAILED DESCRIPTION OF THE INVENTION

Figure 1:
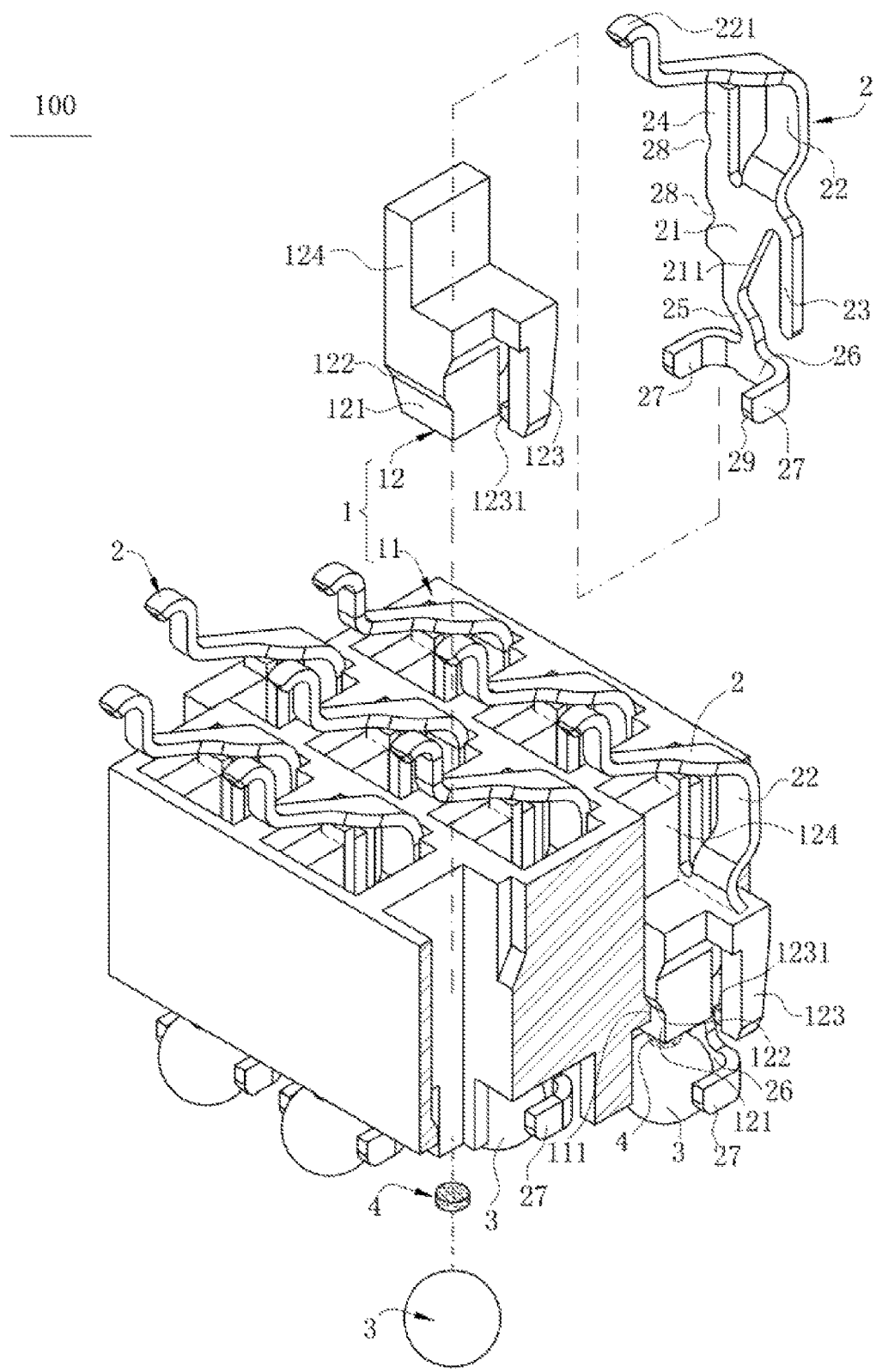
FIG. 1 is a three-dimensional sectional exploded view of an electrical connector according to a first embodiment of the present invention.
Figure 2:
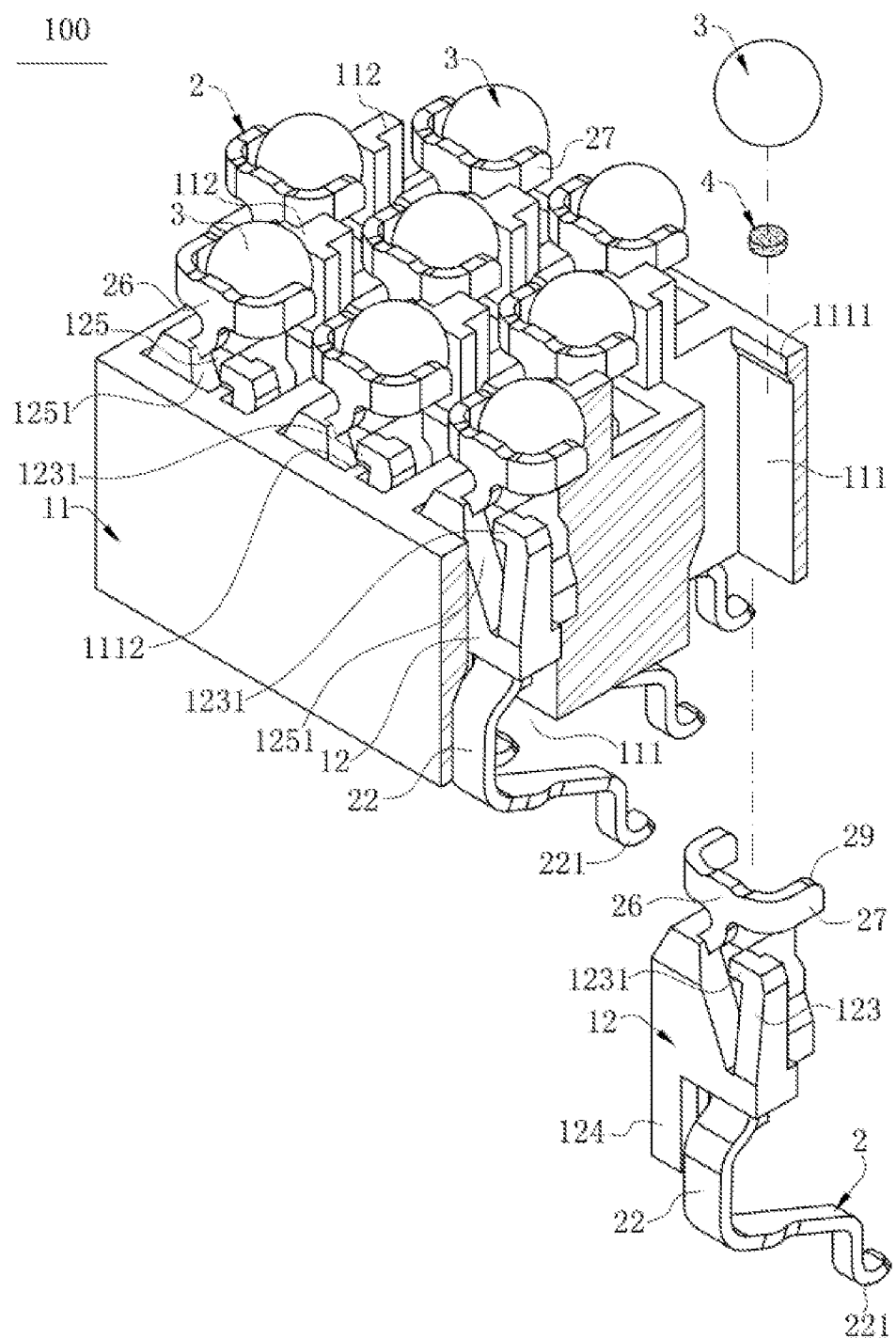
FIG. 2 is a three-dimensional sectional exploded view of an electrical connector according to a first embodiment of the present invention viewed from another view angle.
Figure 3A:
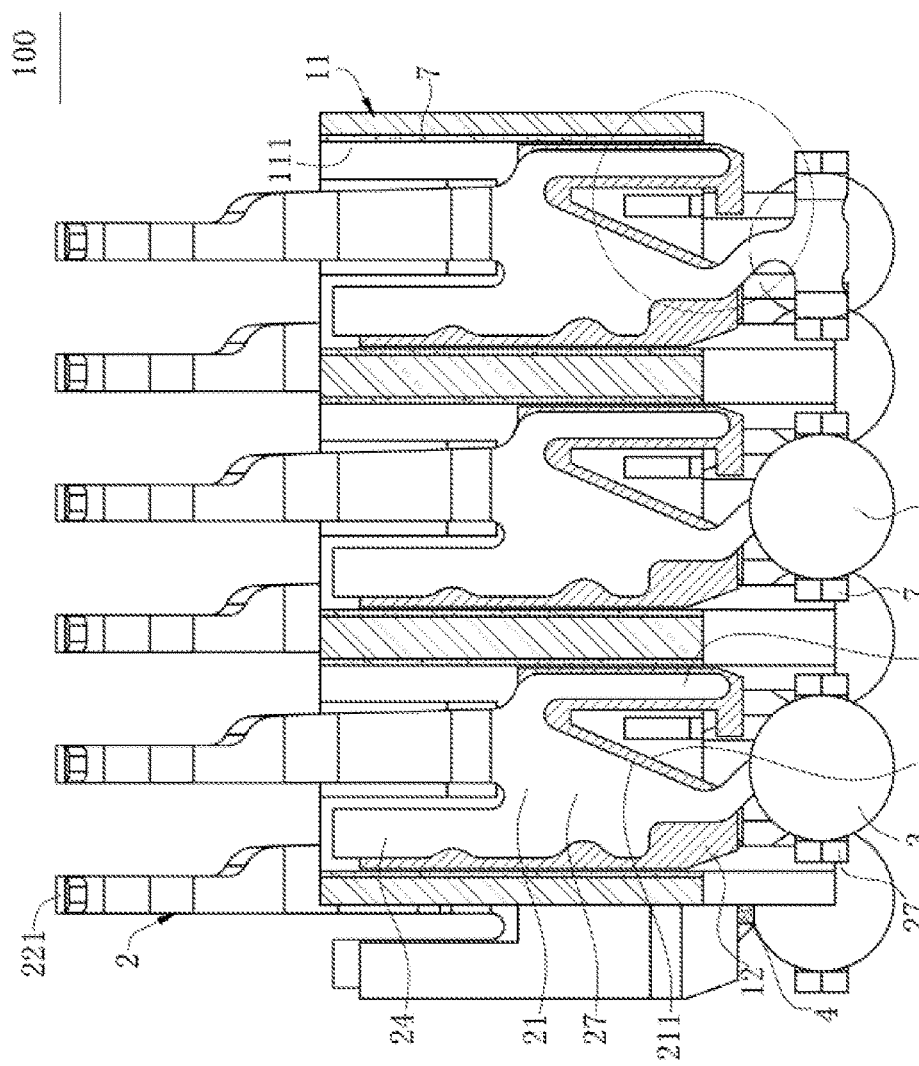
FIG. 3A is a sectional exploded view of an electrical connector according to the present invention.
Figure 3B:
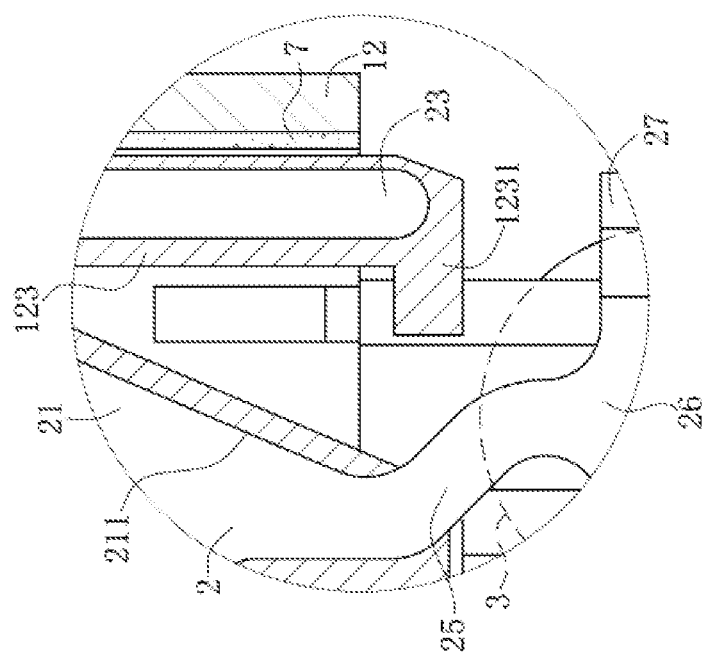
FIG. 3B is an enlarged view of a part that is highlighted by a circle in FIG. 3A.
Figure 4:
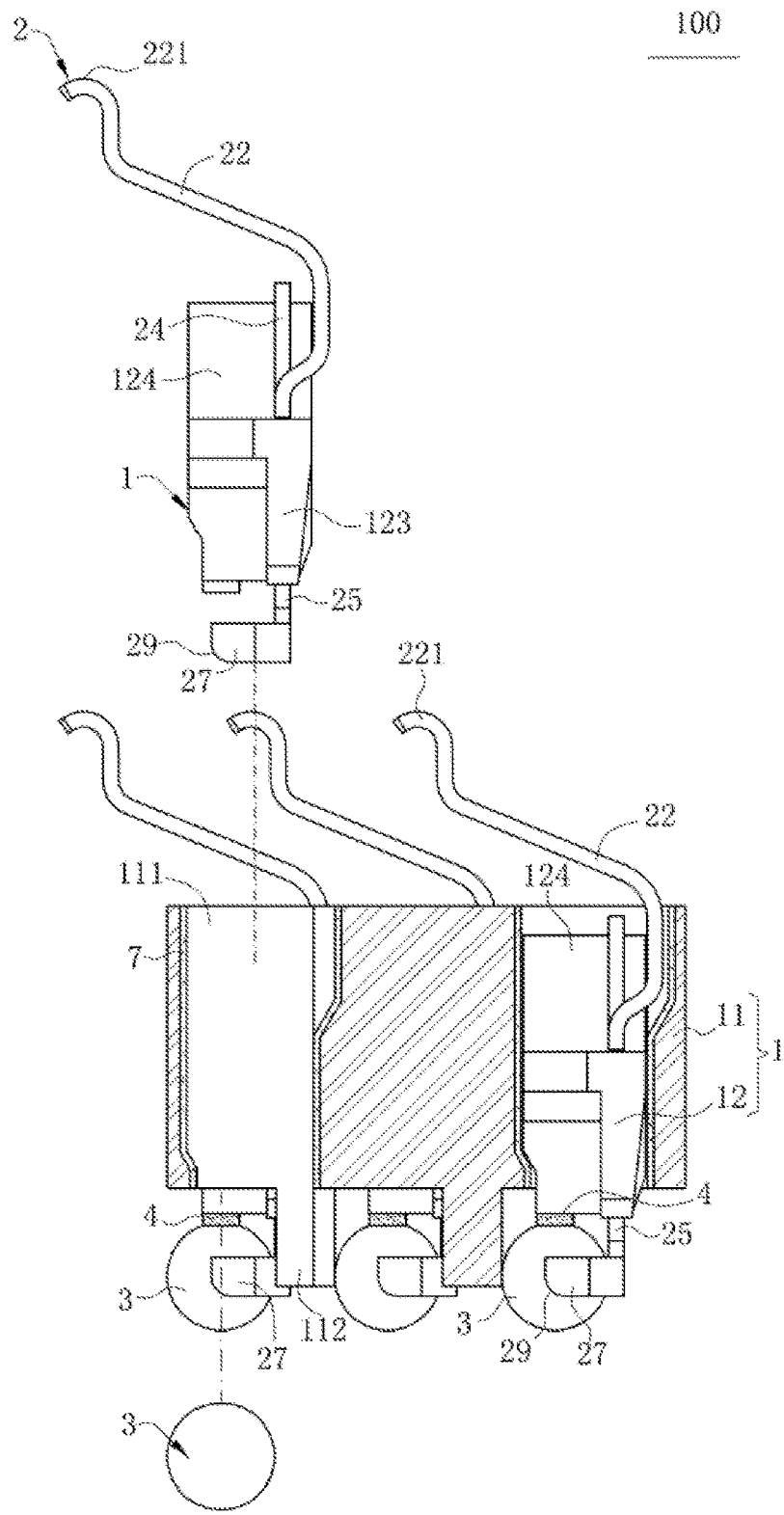
FIG. 4 is a sectional exploded view of an electrical connector according to the present invention viewed from another view angle.

The present invention is more particularly described in the following examples that are intended as illustrative only since numerous modifications and variations therein will be apparent to those skilled in the art. Various embodiments of the invention are now described in detail. Referring to the drawings, like numbers indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise. Moreover, titles or subtitles may be used in the specification for the convenience of a reader, which shall have no influence on the scope of the present invention.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the terms "comprising", "including", "carrying", "having", "containing", "involving", and the like are to be understood to be open-ended, i.e., to mean including but not limited to.

Figure 5A:
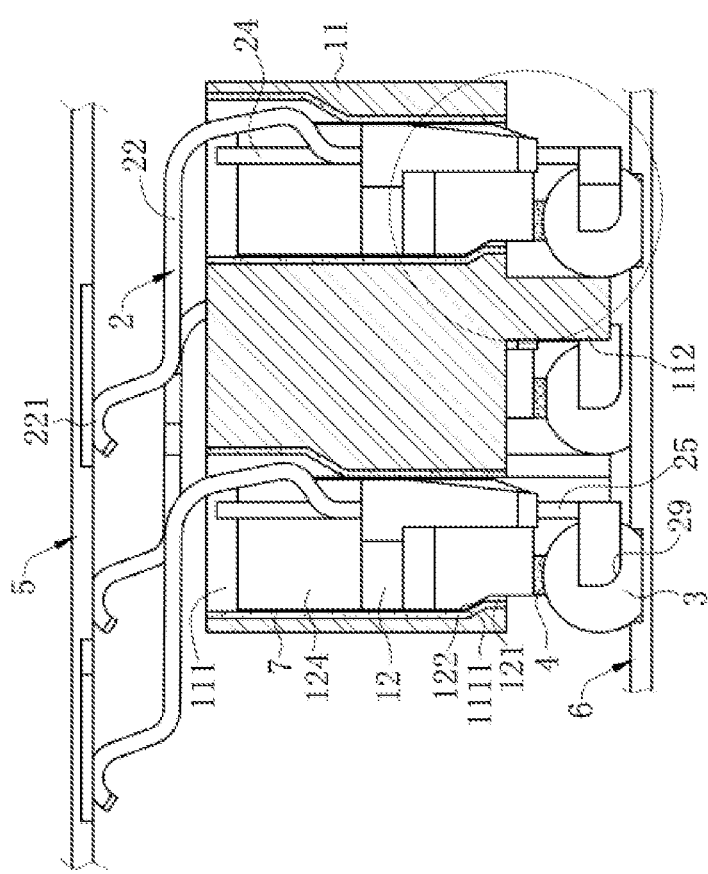
FIG. 5A is a sectional view of an electrical connector according to a first embodiment of the present invention after a chip module and a circuit board are mounted.

The description will be made as to the embodiments of the present invention in conjunction with the accompanying drawings in FIGS. 1-10. In accordance with the purposes of this invention, as embodied and broadly described herein, this invention, in one aspect, relates to an electrical connector. A first embodiment for an electrical connector 100 of the present invention is shown in FIG. 1 and FIG. 5. The electrical connector 100 of the present invention is used for electrically connecting a chip module 5 to a circuit board 6, and includes: an insulating body 1, the insulating body 1 being provided with a plurality of receiving slots 111 running through a first body 11 vertically; and a plurality of terminals 2, correspondingly received in the receiving slots 111, respectively, each terminal 2 being soldered to the circuit board 6 via a solder ball 3.

As shown in FIG. 1 to FIG. 3A, the insulating body 1 includes the first body 11 provided with the receiving slots 111 and a plurality of second bodies 12 assembled in the receiving slots 111, the receiving slots 111 are staggered in multiple rows, side walls of the receiving slots 111 are coated with metal plating layers 7 for shielding crosstalk between the terminals 2 so as to improve the signal transmission quality of the electrical connector 100. A first stop block 1111 and a second stop block 1112 protrude from two side surfaces of each receiving slot 111. A plurality of protruding blocks 112 are formed by protruding downward from a lower surface of the first body 11, and each protruding block 112 correspondingly abuts against the solder ball 3. The second body 12 is provided with a stopping portion 121 located above the solder ball 3, and a bottom surface of the stopping portion 121 is coated with an adhesive 4, such that the solder ball 3 is adhered to the bottom surface of the stopping portion 121. In the present embodiment, the adhesive 4 is a red adhesive. In other embodiments, the adhesive 4 is a red adhesive or any other adhesive which stably adheres the solder ball 3 to the stopping portion 121, and is not limited herein. The second body 12 has a first inclined surface 122 and a positioning arm 123. The first inclined surface 122 is located above the first stop block 1111, such that the first stop block 1111 limits the second body 12 from moving down. A hook portion 1231 is formed at a tail end of the positioning arm 123, and the hook portion 1231 is located below the second stop block 1112, such that the second stop block 1112 limits the second body 12 from moving up. The second body 12 is further provided with a recessed portion 125 to provide a space where the positioning arm 123 elastically deforms, thereby making it convenient to mount the second body 12 into the receiving slot 111. Further, the recessed portion 125 has a second inclined surface 1251, and the distance, from top to bottom, between the second inclined surface 1251 and the positioning arm 123 is gradually increased. In addition, the second body 12 has a retaining block 124.

As shown in FIGS. 1, 3A, 3B and 4, the terminals 2 are formed into the second bodies 12 in an insert-mold manner. Each terminal 2 is provided with a base 21. An elastic arm 22 is formed by bending and extending upward from the base 21, and a contact portion 221 is formed at a top end of the elastic arm 22 and is in upward contact with the chip module 5. An extending arm 23 is formed by vertically extending downward from one side of the base 21, and the extending arm 23 is embedded into the positioning arm 123 to enhance the strength of the positioning arm 123. A strip connecting portion 24 is formed by vertically extending upward from another side of the base 21, and the strip connecting portion 24 is embedded into the retaining block 124. Further, one side of the strip connecting portion 24 and one side of the base 21 are provided with a recess 28 separately, for filling plastic to enhance a retaining force exerted in the second body 12 by the terminal 2. An elastic portion 25 extends downward from the base 21 to a direction close to the extending arm 23, a tail end of the elastic portion 25 is connected to a connecting portion 26 to form a flat shape, the connecting portion 26 and the protruding block 112 are located on two opposite sides of the solder ball 3, and two clamping portions 27 are formed by bending and extending from two opposite sides of the connecting portion 26 along a horizontal direction. In such a way, the connecting portion 26, the two clamping portions 27 and the protruding block 112 can clamp the solder ball 3 simultaneously in four directions, thereby enhancing the mounting stability of the solder ball 3. Further, a chamfer 29 is provided at a tail end of the clamping portion 27, thereby preventing the solder ball 3 from being scratched during mounting. The elastic portion 25 enables the connecting portion 26 to elastically move up, thereby preventing the connecting portion 26 from being broken by an upward impact in a mounting process of the solder ball 3. In addition, the two clamping portions 27 clamp a periphery of the solder ball 3 on a horizontal center plane of the solder ball 3 (certainly, in other embodiments, the two clamping portions 27 can also clamp a periphery below a horizontal center line of the solder ball 3), thereby ensuring that the periphery of the solder ball 3 clamped by the two clamping portions 27 has a maximum perimeter, and increasing the clamping force. The base 21 has an inclined side 211, and the distance, from top to bottom, between the inclined side 211 and the extending arm 23 is gradually increased so as to match the layout of the second inclined surface 1251 on the second body 12 to make the base 21 completely embedded into the second body 12.

As shown in FIGS. 1, 4, 5A and 5B, during assembly of the electrical connector 100 of the present invention, each terminal 2 and the corresponding second body 12 are formed in an insert-mold manner, the second body 12 is correspondingly inserted into the receiving slot 111 from top to bottom, and then the solder ball 3 is pressed between the two clamping portions 27 from bottom to top, such that the solder ball 3 is adhered to the bottom surface of the stopping portion 121.

Figure 6:
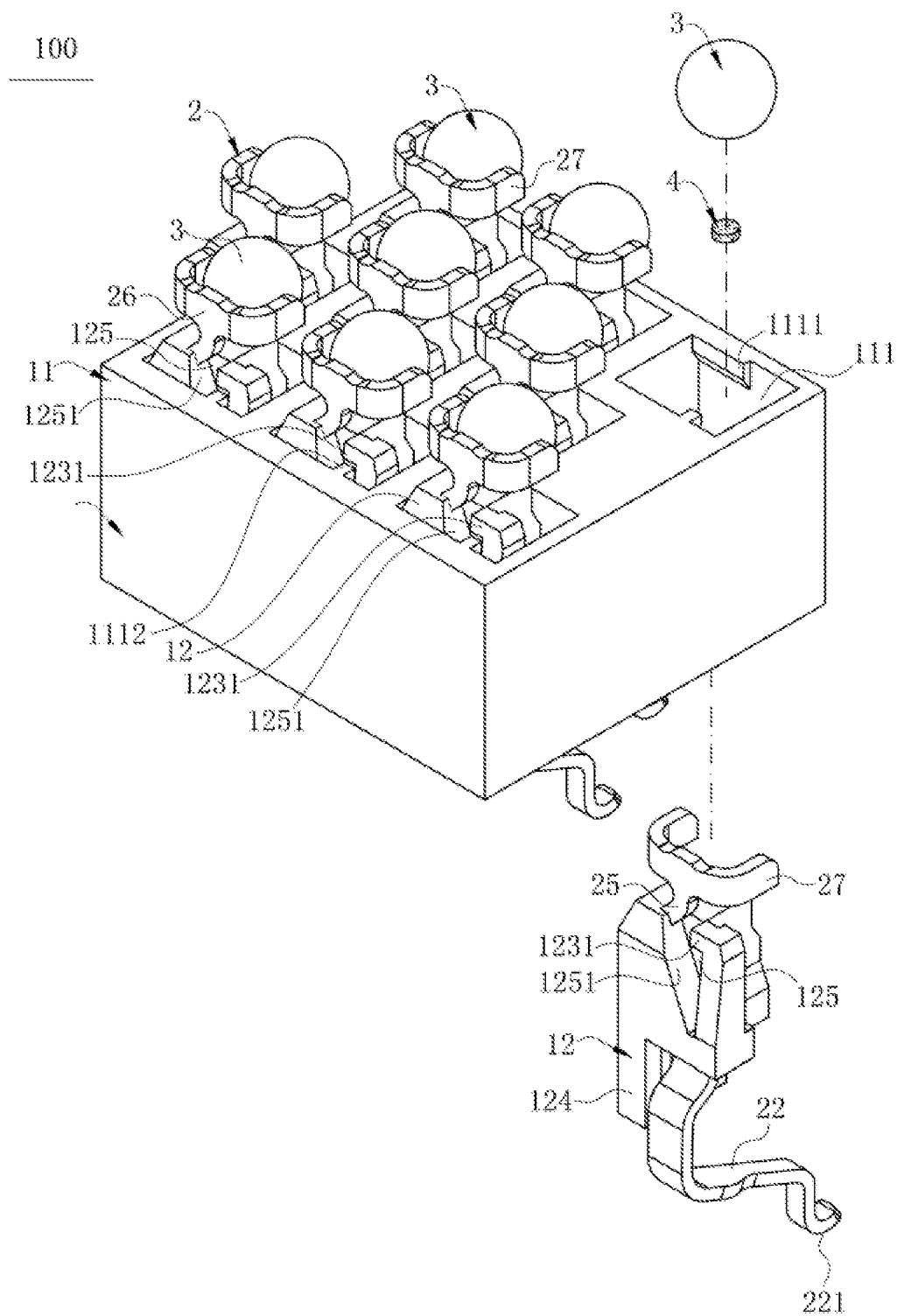
FIG. 6 is a three-dimensional exploded view of an electrical connector according to a second embodiment of the present invention.

A second embodiment for the electrical connector of the present invention is shown in FIG. 6. The difference between the second embodiment and the first embodiment lies in that the protruding block 112 is not provided on the lower surface of the first body 11, and the solder ball 3 is clamped only by the two clamping portions 27 and the connecting portion 26 in three directions, such that the electrical connector 100 has a simple structure. Other structures and functions are identical to those of the first embodiment, which will not be elaborated herein.

Figure 7:
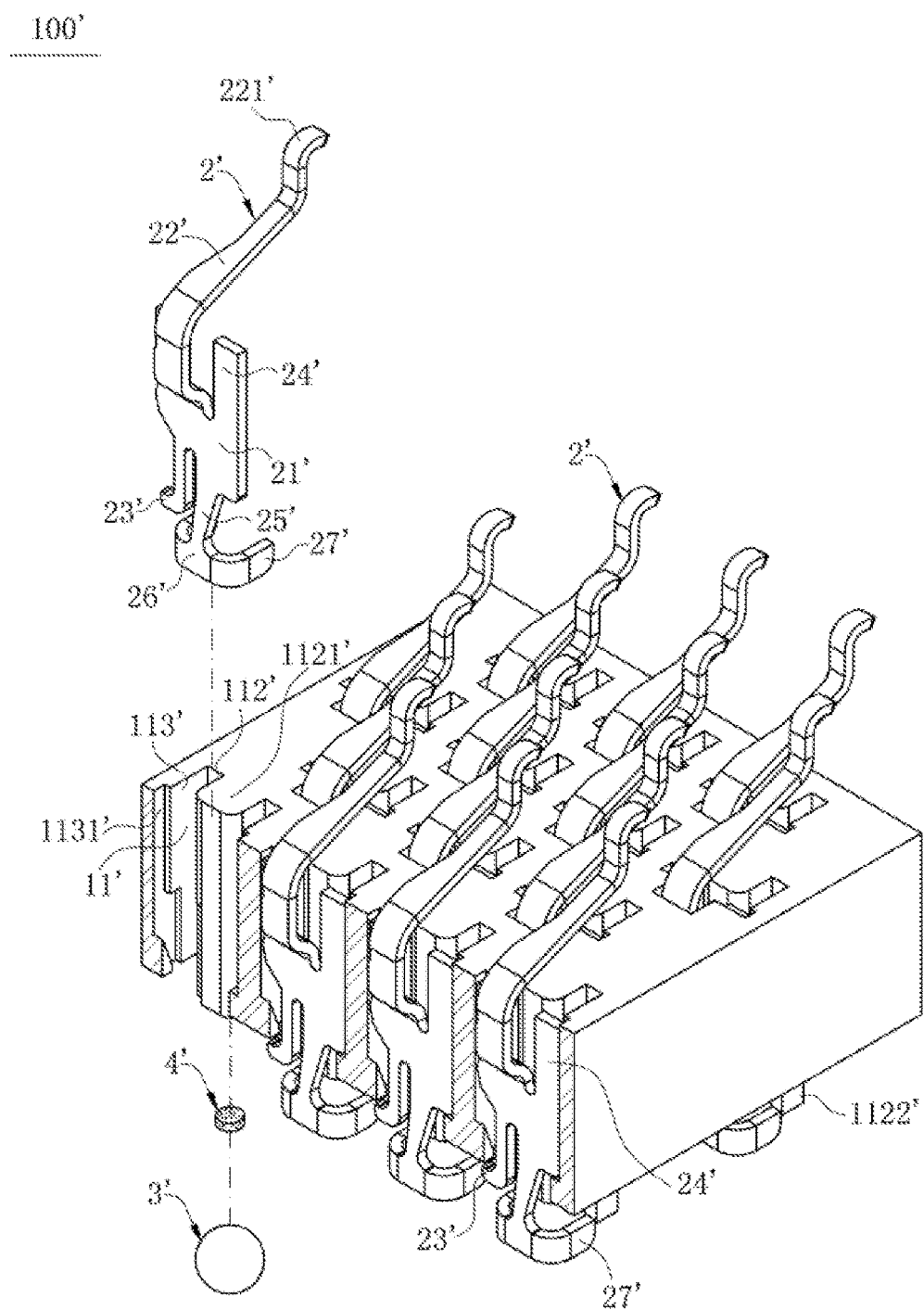
FIG. 7 is a three-dimensional sectional exploded view of an electrical connector according to a third embodiment of the present invention.
Figure 8:
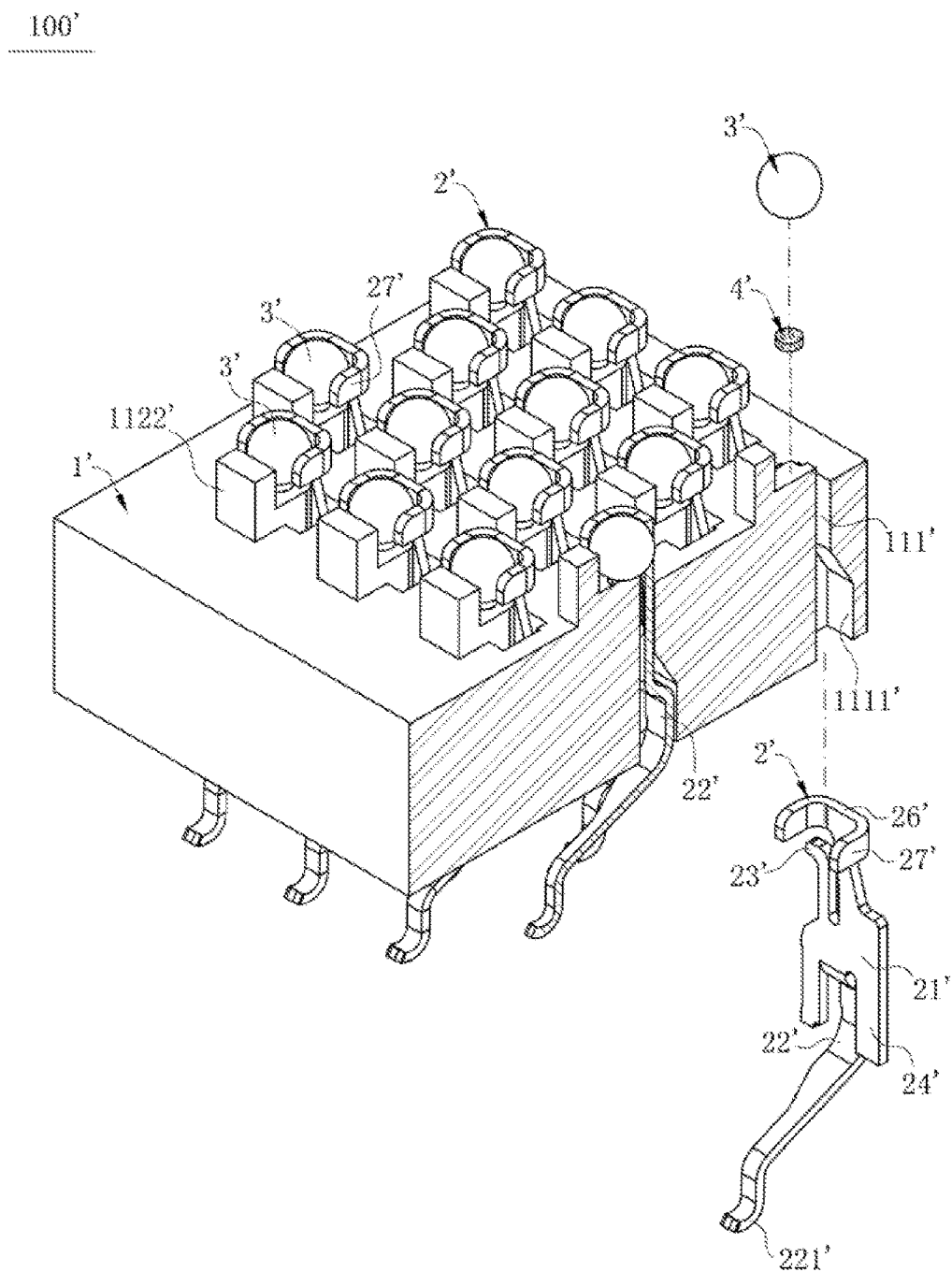
FIG. 8 is a three-dimensional sectional exploded view of an electrical connector according to a third embodiment of the present invention viewed from another view angle.
Figure 9:
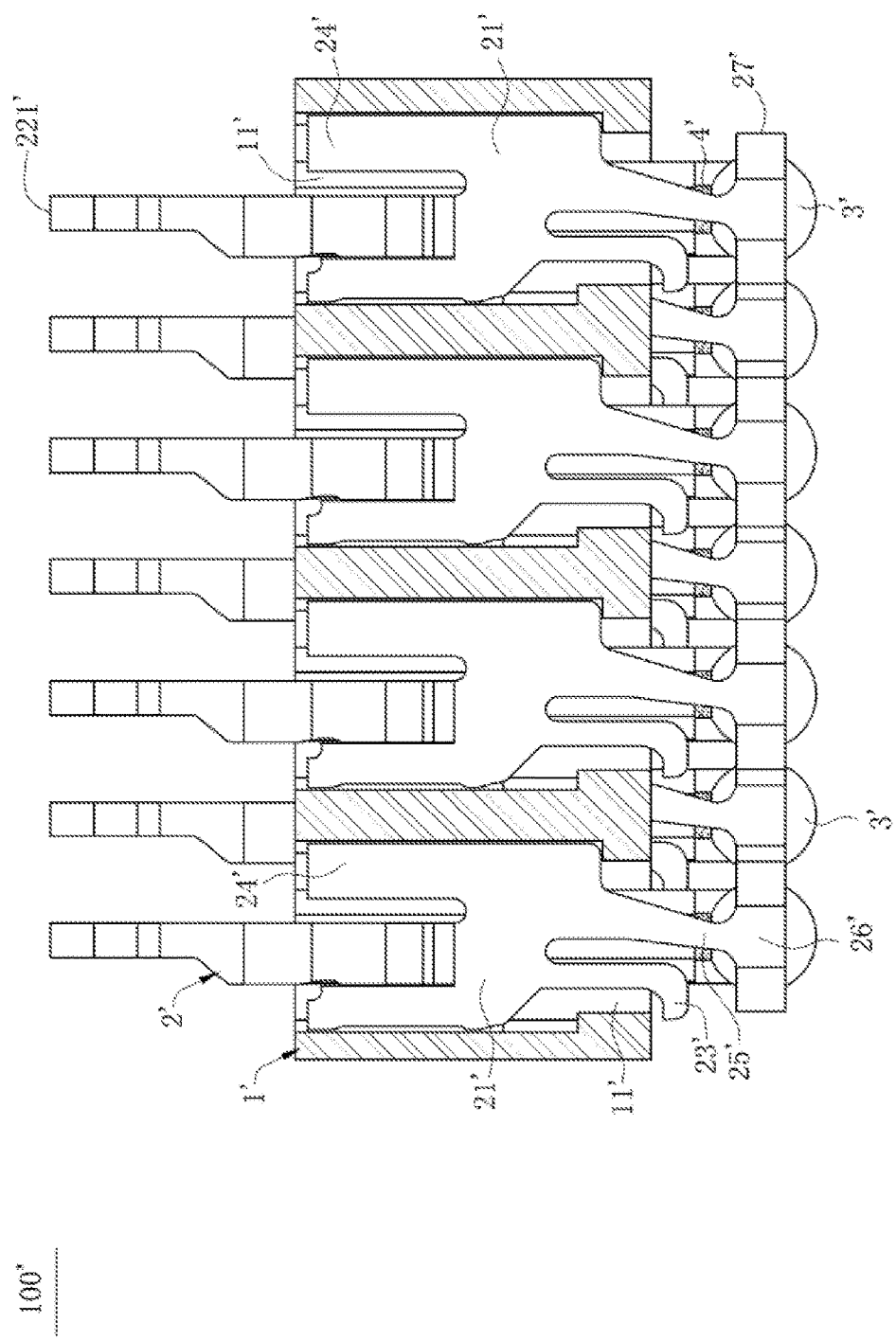
FIG. 9 is a sectional exploded view of an electrical connector according to a third embodiment of the present invention.

A third embodiment for an electrical connector 100' of the present invention is shown in FIGS. 7-9. In the present embodiment, the electrical connector 100' comprises an insulating body 1', a plurality of terminals 2' and a plurality of solder balls 3'.

The terminal 2' includes a base 21' in a flat shape, an elastic arm 22' is formed by bending and extending upward from a top end of the base 21', and a contact portion 221' is formed at a top end of the elastic arm 22' and is in upward contact with a chip module. Two strip connecting portions 24' are formed by vertically extending upward from the base 21', are located on two opposite sides of the elastic arm 22', and are used for connecting a strip. A clamp hook 23' is formed by vertically extending downward from the base 21' and is fastened on a lower surface of the insulating body 1', thereby preventing the terminal 2' from moving up. An elastic portion 25' is formed by vertically extending downward from the base 21', a top end of the elastic portion 25' is lower than a top end of the clamp hook 23', and a clearance is provided between the elastic portion 25' and the clamp hook 23', such that the clamp hook 23' can elastically deform. A connecting portion 26' in a flat shape is formed by extending downward from the elastic portion 25', and two clamping portions 27' are formed by bending and extending from two opposite sides of the connecting portion 26' along a horizontal direction and clamp a periphery of the solder ball on a horizontal center plane of the solder ball 3'.

The insulating body 1' is an integrally formed plastic block. The insulating body 1' is provided with a plurality of receiving slots 11', which run through the insulating body 1' vertically. The receiving slots 11' are disposed in rows and are used for receiving the terminals 2'. Each of the receiving slot 11' has a first side wall 111', a second side wall 112' opposite to the first side wall 111', and two third side walls 113' connecting the first side wall 111' with the second side wall 112'. The base 21' is provided along the first side wall 111'. A groove 1111' is recessed in a top end of the first side wall 111' and is used for receiving the elastic arm 22'. A limiting groove 1131' is recessed in a top end of the third side wall 113' and limits the strip connecting portion 24'. A stopping portion 1121' protruding from the second side wall 112' to the first side wall 111' is located above the solder ball 3'. The stopping portion 1121' extends upward to an upper surface of the insulating body 1' and protrudes downward out of a lower surface of the insulating body 1'. A bottom surface of the stopping portion 1121' is coated with an adhesive 4', such that the solder ball 3' is adhered to the stopping portion 1121'. The adhesive 4' is exposed from the receiving slot 11', so an operator conveniently observes the situation of adhesion between the solder ball 3' and the stopping portion 1121' during production of the electrical connector 100', thereby improving the production efficiency of the electrical connector 100', and improving the yield thereof. Further, a protruding block 1122' is formed by extending downward from the stopping portion 1121'. The protruding block 1122' and the connecting portion 26' are located on two opposite sides of the solder ball 3' respectively, and the protruding block 1122', the two clamping portions 27' and the connecting portion 26' co-clamp the solder ball 3'.

Figure 10:
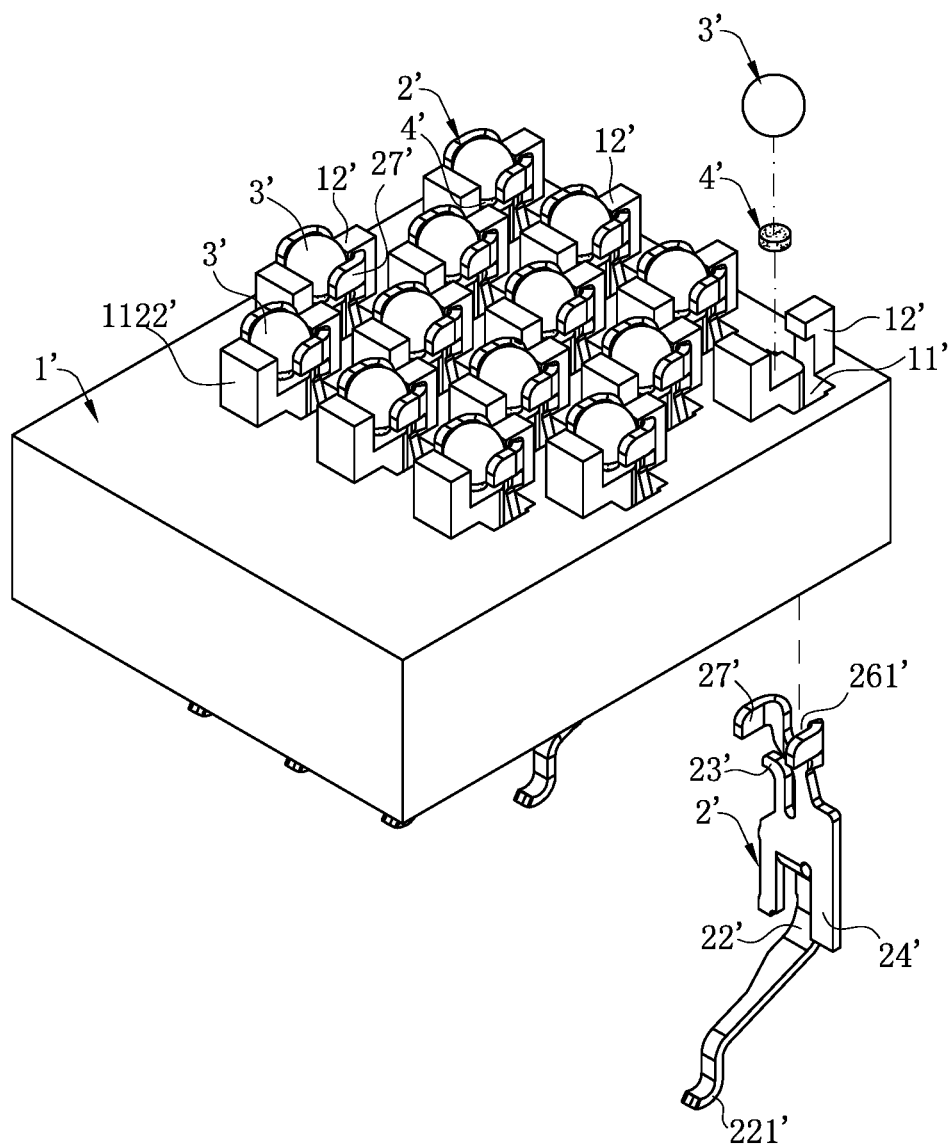
FIG. 10 is a three-dimensional exploded view of an electrical connector according to a fourth embodiment of the present invention.

A fourth embodiment for an electrical connector 100' of the present invention is shown in FIG. 10. The difference between the fourth embodiment and the third embodiment lies in that a notch 261' is provided at a lower edge of the connecting portion 26', a protruding portion 12' protrudes from the insulating body 1' and is received in the notch 261', and the protruding portion 12', the protruding block 1122' and the two clamping portions 27' clamp the solder ball 3' simultaneously from four directions. Other structures and functions are identical to those of the third embodiment, which will not be elaborated herein.

During assembly of the electrical connector 100' of the present invention in the third embodiment and the fourth embodiment, in a process of inserting the terminals 2' into the receiving slots 11' from top to bottom, the clamp hook 23' is extruded by the third side wall 113' and elastically deforms to a direction close to the base 21'. When the clamp hook 23' penetrates out of the receiving slot 11', the stressed extrusion force disappears, the clamp hook 23' is stopped at the lower surface of the insulating body 1' by means of own elasticity return, the terminal 2' is stopped from moving up, the clamping portions 27' are located below the stopping portion 1121', the adhesive 4' is adhered to a bottom surface of the stopping portion 1121', and then the solder ball 3' is clamped by the clamping portions 27' and is adhered to the bottom surface of the stopping portion 1121'.

In summary, the electrical connector 100 of the present invention has the following beneficial advantages:

(1) The solder ball 3 is adhered to the bottom surface of the stopping portion 1121 via the adhesive 4, and the two clamping portions 27 and the connecting portion 26 co-clamp the solder ball 3, or the two clamping portions 27 and the insulating body 1 co-clamp the solder ball 3, such that the solder ball 3 is adhered to and stopped by the stopping portion 1121 in a vertical direction, and clamping forces in at least three directions are exerted in a horizontal direction, thereby improving the stability of the solder ball 3, and improving the production yield of the electrical connector 100.

(2) The side walls of the receiving slots 111 are coated with the metal plating layers 7, and the terminals 2 and the second bodies 12 formed in an insert-mold manner are inserted into the receiving slots 111, such that the terminals 2 and the metal plating layers 7 are prevented from being short-circuited, and crosstalk between the terminals 2 can be shielded by the metal plating layers 7, thereby improving the signal transmission quality of the electrical connector 100.

(3) The stopping portion 1121' protruding downward from the lower surface of the insulating body 1' is located above the solder ball 3'. The bottom surface of the stopping portion 1121' is coated with the adhesive 4', and the solder ball 3' is adhered to the stopping portion 1121'. Thus, the adhesive 4' can be exposed from the receiving slot 11', so an operator conveniently observes the situation of adhesion between the solder ball 3' and the stopping portion 1121' during production of the electrical connector 100', thereby improving the production efficiency of the electrical connector 100', and improving the yield thereof.

(4) The elastic portion 25 extends downward from the base 21 to a direction close to the extending arm 23 and is connected to the connecting portion 26, thereby improving the elasticity of the elastic portion 25, making it convenient for the connecting portion 26 to elastically move up, and preventing the connecting portion 26 from being broken by an upward impact in a mounting process of the solder ball 3.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to enable others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. An electrical connector for electrically connecting a chip module to a circuit board, comprising:
    an insulating body having a plurality of receiving slots, wherein the insulating body is provided with a protruding portion;
    a plurality of terminals respectively received in the receiving slots and in contact with the chip module, each of the terminals having a connecting portion and two clamping portions extending and bending from two opposite sides of the connecting portion along a horizontal direction, wherein a lower edge of the connecting portion has a notch, and the protruding portion is received in the notch; and
    a plurality of solder balls for soldering the terminals to the circuit board,
    wherein each of the solder balls is clamped by the two clamping portions and the protruding portion; and
    wherein the insulating body is provided with a plurality of stopping portions, each located above corresponding one of the solder balls, a bottom surface of each of the stopping portions is coated with an adhesive, and each of the solder balls is adhered to corresponding one of the stopping portions through the adhesive.

2. The electrical connector of claim 1, wherein the two clamping portions together clamp a periphery of the solder ball on a horizontal center plane of the solder ball.

3. The electrical connector of claim 1, wherein a plurality of protruding blocks protrude downward from a lower surface of the insulating body, each of the protruding blocks and corresponding one of the connecting portions are located on two opposite sides of corresponding one of the solder balls, and the protruding block, the protruding portion, and the two clamping portions together clamp corresponding one of the solder balls.

4. The electrical connector of claim 1, wherein the stopping portions are formed by protruding downward from a lower surface of the insulating body.

5. The electrical connector of claim 1, wherein a protruding block is formed by extending downward from at least one of the stopping portions, the protruding block and the two clamping portions together clamp corresponding one of the solder balls.

6. The electrical connector of claim 5, wherein the protruding block and corresponding one of the connecting portions are located on two opposite sides of the corresponding one of the solder balls.

7. An electrical connector for electrically connecting a chip module to a circuit board, comprising:
    an insulating body having a plurality of receiving slots, wherein the insulating body comprises:
        a first body having the plurality of receiving slots; and
        a plurality of second bodies assembled within the first body,
        wherein the second bodies are received in the receiving slots;
    a plurality of terminals respectively insert-molded with the second bodies and in contact with the chip module, each of the terminals having a connecting portion and two clamping portions extending and bending from two opposite sides of the connecting portion along a horizontal direction; and
    a plurality of solder balls for soldering the terminals to the circuit board,
    wherein each of the solder balls is clamped by the two clamping portions and the connecting portion, or by the two clamping portions and the insulating body; and
    wherein the second bodies are provided with a plurality of stopping portions, each located above corresponding one of the solder balls, the stopping portions are integrally formed on the second bodies, a bottom surface of each of the stopping portions is coated with an adhesive, and each of the solder balls is adhered to corresponding one of the stopping portions through the adhesive.

8. The electrical connector of claim 7, wherein side walls of the receiving slots are coated with metal plating layers.

9. The electrical connector of claim 7, wherein at least one of the second bodies has a first inclined surface, at least one of the receiving slots has a side surface protruding to form a first stop block, and the first stop block is located below the first inclined surface to limit the second body from moving down.

10. The electrical connector of claim 7, wherein at least one of the second bodies has a positioning arm, having a tail end and a hook portion formed at the tail end, at least one of the receiving slots has a side surface protruding to form a second stop block, and the second stop block is located above the hook portion to limit the second body from moving up.

11. The electrical connector of claim 10, wherein the second body has a recessed portion to provide a space where the positioning arm elastically deforms, the recessed portion has a second inclined surface, and a distance between the second inclined surface and the positioning arm gradually increases along a direction from the stopping portions to the solder balls.

12. The electrical connector of claim 10, wherein at least one of the terminals has an extending arm embedded into the positioning arm.

13. The electrical connector of claim 12, wherein the second body has a retaining block, and each of the terminals further comprises:
    a base;
    an elastic arm, formed by bending and extending upward from the base;
    a contact portion, formed at a top end of the elastic arm and in upward contact with the chip module; and
    a strip connecting portion for connecting a strip, formed by vertically extending upward from a first side of the base, and embedded into the retaining block,
    wherein the extending arm is formed by vertically extending downward from a second side of the base opposite to the first side.

14. The electrical connector of claim 13, wherein one of the base and one side of the strip connecting portion has a recess.

15. The electrical connector of claim 13, wherein an elastic portion extends downward from the base along a direction toward the extending arm so as to be connected to the connecting portion.

16. The electrical connector of claim 13, wherein the base has an inclined side, and a distance between the inclined side and the extending arm gradually increases along a direction from the stopping portions to the solder balls.

17. An electrical connector for electrically connecting a chip module to a circuit board, comprising:
- an insulating body having a plurality of receiving slots;
- a plurality of terminals respectively received in the receiving slots, each of the terminals having a connecting portion and two clamping portions extending and bending from two opposite sides of the connecting portion along a horizontal direction, wherein each of the terminals further comprises:
  - a base in a flat plate shape;
  - a clamp hook, formed by vertically extending downward from the base;
  - an elastic portion, formed by vertically extending downward from the base, and connected to the connecting portion;
  - an elastic arm, formed by bending and extending upward from the base, having
  - a contact portion, formed at a top end of the elastic arm and in upward contact with the chip module; and
  - a strip connecting portion for connecting a strip, formed by vertically extending upward from the base,
  - wherein a clearance is provided between the clamp hook and the elastic portion; and
- a plurality of solder balls for soldering the terminals to the circuit board,
- wherein each of the solder balls is clamped by the two clamping portions and the connecting portion, or by the two clamping portions and the insulating body; and
- wherein the insulating body is provided with a plurality of stopping portions, each located above corresponding one of the solder balls, a bottom surface of each of the stopping portions is coated with an adhesive, and each of the solder balls is adhered to corresponding one of the stopping portions through the adhesive.

18. The electrical connector of claim 17, wherein at least one of the stopping portions extends upward to an upper surface of the insulating body.

\* \* \* \* \*